(12) United States Patent
Goodman et al.

(10) Patent No.: US 12,512,362 B2
(45) Date of Patent: Dec. 30, 2025

(54) SUSCEPTOR IMPROVEMENT

(71) Applicant: Applied Materials, Inc., Santa Clara, CA (US)

(72) Inventors: Matthew Gabriel Goodman, Phoenix, AZ (US); John Tolle, Gilbert, AZ (US); Shawn Thomas, Chesterfield, MO (US); Lori D. Washington, San Jose, CA (US); Xinning Luan, Tempe, AZ (US); Zhepeng Cong, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 328 days.

(21) Appl. No.: 18/108,272

(22) Filed: Feb. 10, 2023

(65) Prior Publication Data

US 2024/0274464 A1    Aug. 15, 2024

(51) Int. Cl.
*H01L 21/687* (2006.01)

(52) U.S. Cl.
CPC .. *H01L 21/68757* (2013.01); *H01L 21/68785* (2013.01)

(58) Field of Classification Search
CPC ......... H01L 21/68757; H01L 21/68785; H01L 21/67115; H01L 21/68735
See application file for complete search history.

(56) References Cited

U.S. PATENT DOCUMENTS

| | | |
|---|---|---|
| 2006/0060145 A1 | 3/2006 | Van Den Berg et al. |
| 2010/0129990 A1 | 5/2010 | Nishizawa et al. |
| 2021/0040643 A1 * | 2/2021 | Sakaguchi .............. C30B 29/36 |
| 2022/0076988 A1 | 3/2022 | Chen et al. |
| 2022/0352006 A1 | 11/2022 | Huang et al. |

FOREIGN PATENT DOCUMENTS

| | | |
|---|---|---|
| EP | 1965412 A1 | 9/2008 |
| JP | 2017-098441 A | 6/2017 |
| KR | 10-2015-0015347 A | 2/2015 |
| KR | 2015015347 A * | 2/2015 |

OTHER PUBLICATIONS

English translation KR2015015347 (Year: 2015).*
International Search Report and Written Opinion dated May 20, 2024 for Application No. PCT/US2024/012083.

* cited by examiner

*Primary Examiner* — Jason L Vaughan
*Assistant Examiner* — Amanda Kreiling
(74) *Attorney, Agent, or Firm* — Patterson + Sheridan, LLP (57) ABSTRACT

A susceptor for processing a substrate is provided including a base and a coating formed over the base. The base includes an outer rim having an inner edge, an outer edge, and a top connecting the inner edge to the outer edge; and an inner dish disposed inside the outer rim and coupled to the outer rim, the inner dish recessed from the top of the outer rim, the inner dish having a front side and an opposing back side. The coating has an outer surface that includes a first portion formed over the front side of the inner dish. The first portion of the outer surface of the coating includes a first region and a second region, the first region has a first average level of roughness, the second region has a second average level of roughness.

20 Claims, 6 Drawing Sheets

SUSCEPTOR IMPROVEMENT

BACKGROUND

Field

Embodiments of the present disclosure generally relate to a susceptor for use in processing of substrates (e.g., semiconductor substrates), and more particularly to a susceptor having features to improve thermal uniformity across a substrate during processing.

Description of the Related Art

Susceptors are often used in epitaxy processes to support a substrate as well as to heat the substrate to a highly uniform temperature. Susceptors often have platter or dish-shaped upper surfaces that are used to support a substrate from below around the edge(s) of the substrate while leaving a small gap between the remaining lower surface of the substrate and the upper surface of the susceptor. Precise control over a heating source, such as a plurality of heating lamps disposed below the susceptor, allows a susceptor to be heated within very strict tolerances. The heated susceptor can then transfer heat to the substrate, primarily by radiation emitted by the susceptor.

Despite the precise control of heating the susceptor in epitaxy, temperature non-uniformities persist across the upper surface of the substrate often reducing the quality of the process (e.g., deposition) being performed on the substrate. Therefore, a need exists for an improved susceptor for supporting and heating substrates in processing, such as semiconductor processing.

SUMMARY

Embodiments of the present disclosure generally relate to a susceptor for use in processing of substrates (e.g., semiconductor substrates), and more particularly to a susceptor with regions of one or more surfaces of the susceptor having different levels of roughness to improve thermal uniformity across a substrate during processing.

In one embodiment, a susceptor for processing a substrate is provided including a base and a coating formed over the base. The base includes an outer rim having an inner edge an outer edge, and a top connecting the inner edge to the outer edge; and an inner dish disposed inside the outer rim and coupled to the outer rim, the inner dish recessed from the top of the outer rim, the inner dish having a front side and an opposing back side. The coating has an outer surface that includes a first portion formed over the front side of the inner dish, wherein the first portion of the outer surface of the coating includes a first region and a second region, the first region has a first average level of roughness, the second region has a second average level of roughness, and the first average level of roughness is at least 50% greater than or 33% less than the second average level of roughness.

In another embodiment, a susceptor for processing a substrate is provided, a base and a coating formed over the base. The base includes an outer rim having an inner edge, an outer edge, and a top connecting the inner edge to the outer edge; and an inner dish disposed inside the outer rim and coupled to the outer rim, the inner dish recessed from the top of the outer rim, the inner dish having a front side and an opposing back side. The coating has an outer surface that includes a first portion formed over the back side of the inner dish, wherein the first portion of the outer surface of the coating includes a first region and a second region, the first region has a first average level of roughness, the second region has a second average level of roughness, and the first average level of roughness is at least 50% greater than or 33% less than the second average level of roughness.

In another embodiment, a susceptor for processing a substrate is provided including a base having an outer rim having an inner edge, an outer edge, and a top connecting the inner edge to the outer edge; and an inner dish disposed inside the outer rim and coupled to the outer rim, the inner dish recessed from the top of the outer rim, the inner dish having a front side and an opposing back side. The outer surface of the base includes a first portion on the front side of the base or the back side of the base, the first portion includes a first region and a second region, the first region has a first average level of roughness, the second region has a second average level of roughness, and the first average level of roughness is at least 50% greater than or 33% less than the second average level of roughness.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a susceptor for use in processing of substrates (e.g., semiconductor substrates), and more particularly to a susceptor with regions of one or more surfaces of the susceptor having different levels of roughness to improve thermal uniformity across a substrate during processing. The surfaces of the susceptor with varying levels of roughness can be internal surfaces or external surfaces. The level of roughness of a region of a surface can affect the heat transferred from that region of the surface to the substrate. Thus, varying the level of roughness across different regions of one or more surfaces of a susceptor can be used to address temperature nonuniformities across different regions of the substrate during processing, which can improve the uniformity of the process being performed on the substrate, such as improved thickness uniformity for a deposition.

Figure 1:
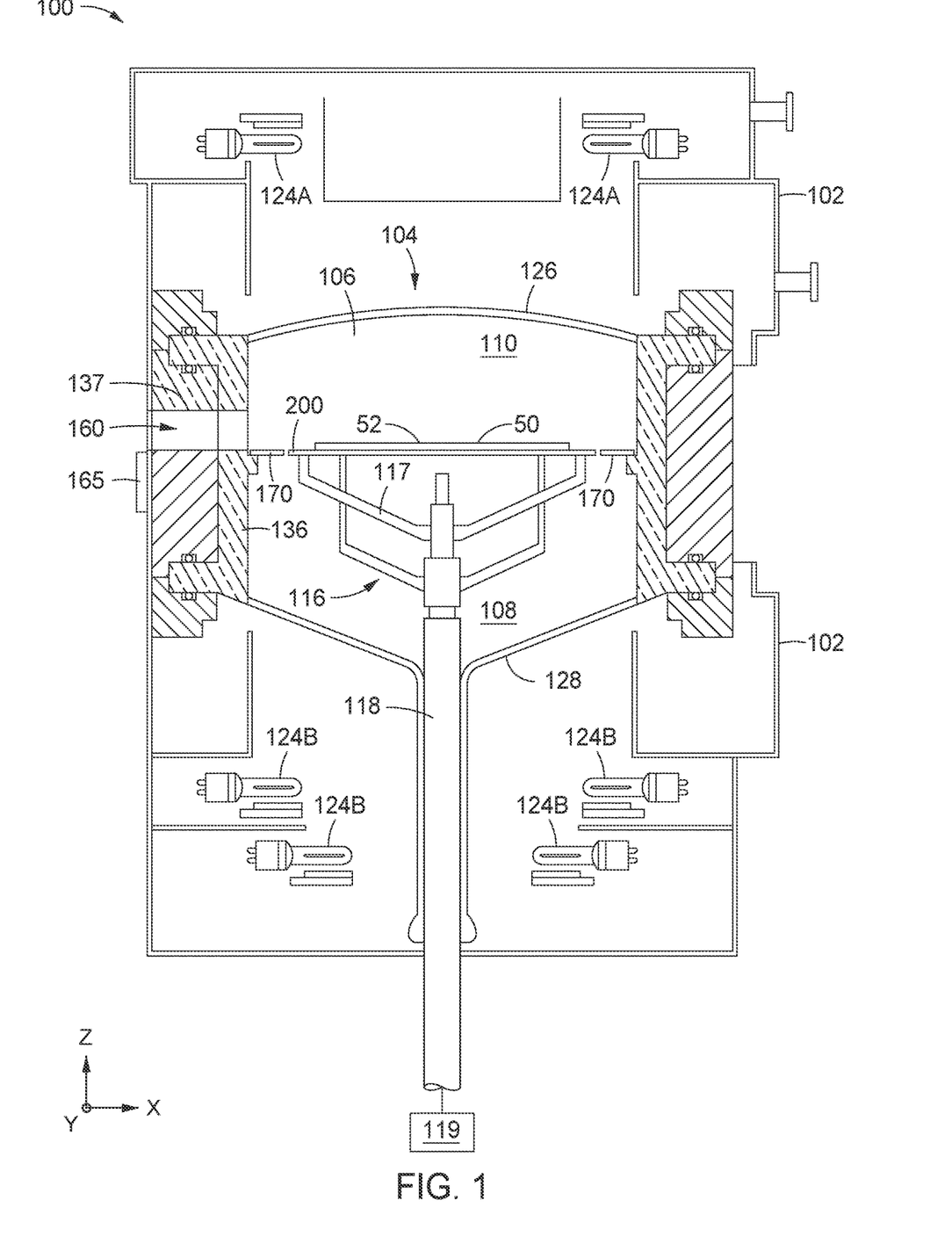
FIG. 1 is a cross sectional view of a processing chamber, according to one embodiment.
Figure 2A:
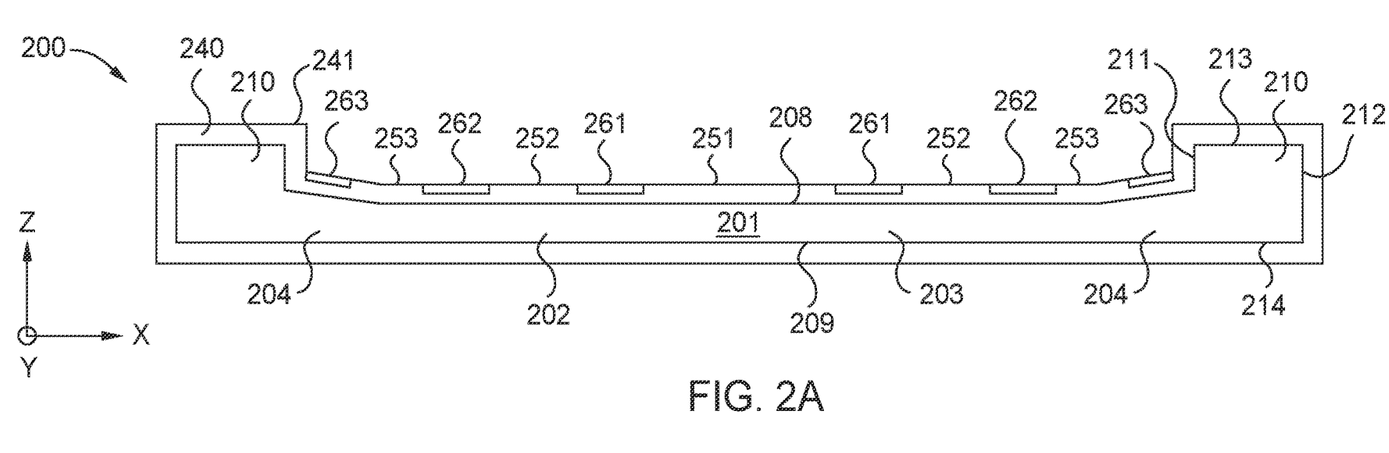
FIG. 2A is a side cross-sectional view of the susceptor from FIG. 1, according to one embodiment.
Figure 2B:
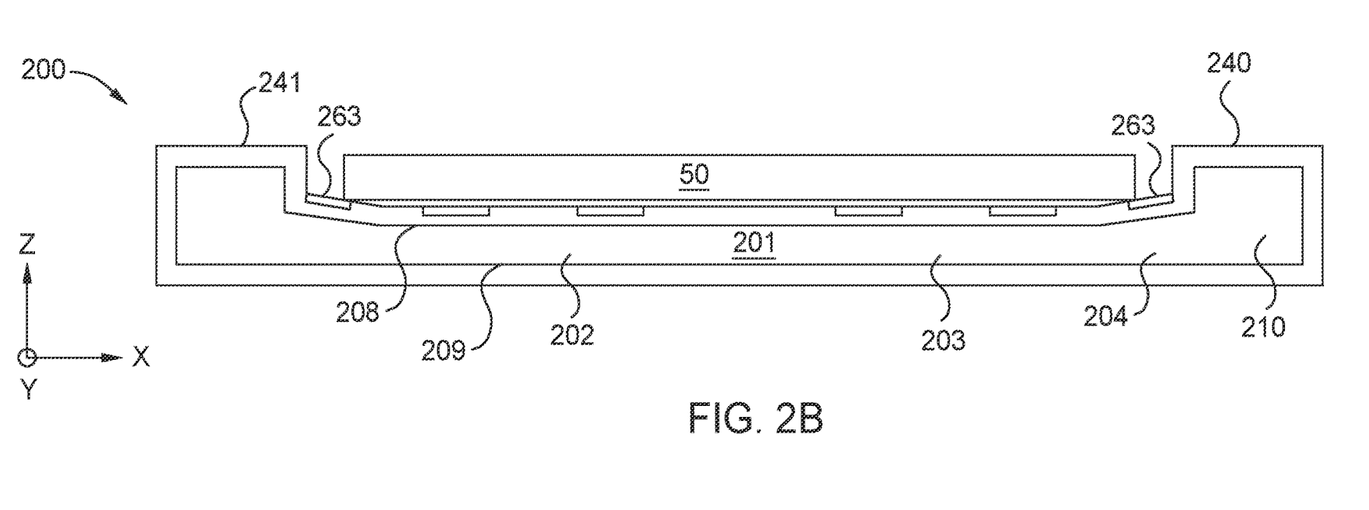
FIG. 2B is a side cross-sectional view of the susceptor from FIG. 1 with the substrate on the susceptor, according to one embodiment.
Figure 2C:
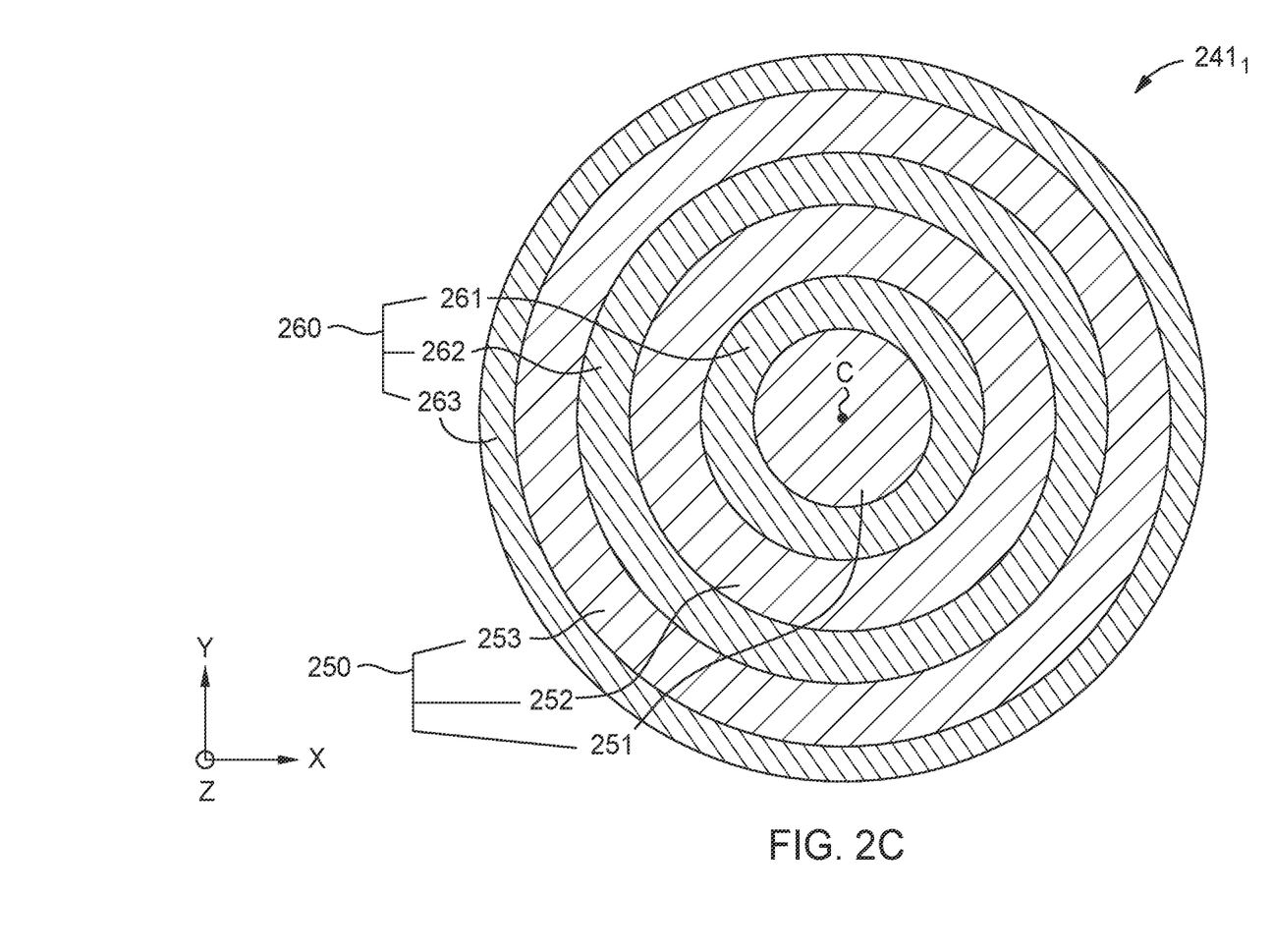
FIG. 2C is a top view of a first portion of the outer surface of the coating on the susceptor from FIG. 1, according to one embodiment.

FIG. 1 is a cross sectional view of a processing chamber 100, according to one embodiment. The processing chamber 100 can be configured to perform an epitaxial (Epi) deposition process. A susceptor 200 is positioned in the processing chamber 100. A substrate 50 is positioned on the susceptor 200. A simplified illustration of the susceptor 200 is shown in FIG. 1. Additional detail on the susceptor 200 is shown in FIGS. 2A-2C. The process chamber 100 is configured to allow the exchange of the substrate 50 through an opening 160, which can be opened by a slit valve 165 of the processing chamber 100.

The processing chamber 100 includes a housing structure 102 made of a process resistant material, such as aluminum or stainless steel, for example 316L stainless steel. The housing structure 102 encloses various functioning elements of the processing chamber 100, such as a quartz chamber 104, which includes an upper quartz chamber 106 and a lower quartz chamber 108. The quartz chamber 104 encloses a processing volume 110 (also referred to as interior volume). One or more liners 136, 137 can insulate the quartz chamber 104 from the housing structure 102.

The process chamber 100 includes a substrate support assembly 116. The substrate support assembly 116 can include supports 117 and a shaft 118. The susceptor 200 can be positioned on the supports 117. The substrate support assembly 116 can further include an actuator 119 to rotate the shaft 118 and the susceptor 200. Rotation of the susceptor 200 during a process generally improves the uniformity of the process, but unfortunately nonuniformities remain, such as temperature nonuniformities on the substrate 50 during the process. The susceptor 200 as well as the other susceptors described in this disclosure include features, such as surfaces with different average levels of roughness to address these nonuniformities.

In some embodiments, the actuator 119 can also to raise and lower the supports 117, which can be useful when transferring a substrate 50 or for use in different processing positions. In some embodiments, the substrate support assembly 116 can include lift pins (not shown) that can raise and lower to facilitate the exchange of the substrate 50. The susceptor 200 can include lift pin holes that the lift pins can extend through.

Reactive species can be provided to the processing volume 110 by a gas distribution assembly (not shown), and processing byproducts can be removed from the processing volume 110 by an outlet port (not shown), which is typically in communication with a vacuum source (not shown). In some embodiments, gases are provided into the outer portions of the processing volume 110, for example through one or more openings in the liners 136, 137. In these embodiments, the gas can flow from the outer portions to regions over the susceptor 200 and substrate 50 and then out through the outlet port.

Purge gas (not shown) can also be provided below the susceptor 200 to prevent the reactive species from entering the regions in the processing volume 110 below the susceptor 200. A preheat ring 170 can be positioned around the susceptor 200. The preheat ring 170 can be used to preheat the reactive species as the gases move from outer portions of the processing volume 110 to inner portions of the processing volume, for example over the susceptor 200. The preheat ring 170 can also be used to control the flow of purge gas around the susceptor 200.

Heating of the substrate 50 and/or the processing volume 110 may be provided by radiation sources, such as upper lamp modules 124A and lower lamp modules 124B. In one embodiment, the upper lamp modules 124A and the lower lamp modules 124B are infrared (IR) lamps.

FIG. 2A is a side cross-sectional view of the susceptor 200 from FIG. 1, according to one embodiment. FIG. 2B is a side cross-sectional view of the susceptor 200 with the substrate 50 on the susceptor 200, according to one embodiment.

The susceptor 200 includes a base 201 and a coating 240 formed over the base 201. The coating 240 includes an outer surface 241. In embodiments, including a coating formed over the base, the outer surfaces of the base can also be referred to as internal surfaces. In some embodiments, the coating 240 can be omitted as described in further detail below. The base 201 can be formed of a ceramic material (e.g., aluminum oxide) or a graphite material. The coating 240 can be a silicon material, such as silicon carbide, or other process resistant material. In some embodiments, the coating 240 can have a substantially uniform thickness over the entire base 201.

The base 201 includes an outer rim 210 and an inner dish 202 coupled to the outer rim 210. The outer rim 210 includes an inner edge 211, an outer edge 212, and a top 213 connecting the inner edge 211 to the outer edge 212. The outer rim 210 further includes a bottom 214 connected to the outer edge 212.

The inner dish 202 includes an outer portion 204 disposed around a central portion 203. The central portion 203 can be flat (i.e., horizontal in FIGS. 2A and 2B). The outer portion 204 can be sloped. The outer portion 204 extends from the central portion 203 to the inner edge 211 of the outer rim 210. The inner dish 202 is recessed from the top 213 of the outer rim 210. The central portion 203 of the inner dish 202 is also recessed from the inner edge 211 of the outer rim 210. Although the outer portion 204 is shown as having a straight slope, in some embodiments the outer portion 204 can be curved. Furthermore, although the central portion 203 is shown as flat, in some embodiments the central portion 203 can be curved (e.g., concave). Furthermore, in some embodiments, the outer portion 204 can be omitted. In some of these embodiments, another feature, such as an annular ridge to support the substrate, can be used to create a gap between the bottom of the substrate 50 and the top of the central portion 203 of the inner dish 202.

The inner dish 202 further includes a front side 208 and an opposing back side 209. The front side 208 is the side that faces the substrate 50 when the substrate 50 is positioned on the susceptor 200. As shown in FIG. 2B, the substrate 50 is spaced apart from a portion of the outer surface 241 of the coating 240 that overlies the central portion 203 of the inner dish 202. The gap between the bottom of the substrate and the front side 208 of the inner dish 202 causes more heating of the substrate to be radiative heating, which can improve temperature uniformity of the substrate relative to conductive heating between contacting surfaces.

FIG. 2C is a top view of a first portion 2411 of the outer surface 241 of the coating 240 on the susceptor 200, according to one embodiment. FIG. 2C is described with additional reference to FIGS. 2A and 2B. The first portion 2411 of the outer surface 241 shown in FIG. 2C overlies the central portion 203 and the outer portion 204 of the inner dish 202. The first portion 2411 of the outer surface 241 of the coating 240 includes a first set of regions 250 and a second set of regions 260 with substantially different average levels of roughness Ra to improve the temperature uniformity of the substrate 50 during processing.

Used herein, the Ra value (also referred to as average level of roughness) for a surface refers to the average of profile height deviations from a mean line for the surface. The Ra value can have units of length (e.g., micrometers (μm) or millimeters (mm)) Also used herein, substantially different average levels of roughness for two or more regions refers to regions in which at least one of the two or more regions has an average level of roughness Ra that is at least 50% greater than or 33% less than the average level of roughness Ra of at least one of the one or more other regions. In some embodiments, the average level of roughness between two regions can be smaller (e.g., one region has an average level of roughness 10% greater than the average level of roughness for the other region) or larger (e.g., one region has an average level of roughness two times greater than the average level of roughness for the other region)

Used herein, an average level of roughness of two regions are considered substantially the same if the average level of roughness for the first region is within plus or minus 5% of average level of roughness for the second region. Although this disclosure generally described different levels of roughness as being different levels of average roughness Ra, other roughness parameters can be used, such as a root mean square average or quadratic average of profile height deviations from a mean line for a surface, and the benefits of this disclosure can be obtained by using these other roughness parameters.

The first set of regions 250 includes a first region 251, a second region 252, and a third region 253. The second set of regions 260 includes a first region 261, a second region 262, and a third region 263.

The regions 261-263 are shown as rectangles in FIGS. 2A, 2B to indicate the location of these regions on the outer surface 241 in the cross-sectional views of FIGS. 2A, 2B. The use of these rectangles is not meant to convey any information about the depth of the regions 261-263 in the Z-direction. The statements in this paragraph concerning the use of rectangles and the depth of these rectangles also apply to the use of the similarly sized rectangles 361-363, 461-463, and 561-563 in FIGS. 3-5.

With reference to FIGS. 2A and 2C, the first region 251 can be a central region. The first region 251 can have a circular shape in a top view. The second region 252 and the third region 253 can have a shape of a ring in a top view. Similarly, the first region 261, the second region 262, and the third region 263 can have a shape of a ring in a top view. The first region 261 is located between the first region 251 and the second region 252. The second region 252 is located between the first region 261 and the second region 262. The second region 262 is located between the second region 252 and the third region 253. The third region 253 is located between the second region 262 and the third region 263. The third region 263 is located between the third region 253 and the inner edge 211 of the outer rim 210. The outer border of the third region 263 in FIG. 2C is the location where the third region 263 contacts the inner edge 211 of the outer rim 210.

The first set of regions 250 are each individually spaced apart from each other by a region of the second set of regions 260. Similarly, the second set of regions 260 are each individually spaced apart from each other by a region of the first set of regions 250. Although there are three regions 250 and three regions 260, in other embodiments there may be more or fewer of each of the regions 250, 260. In one embodiment there is only three total regions, such as an embodiment only including the first region 251, the second region 252, and the first region 261 with the first region 261 located between the first region 251 and the second region 252. Another embodiment may only include two regions of varying roughness, for example when the regions of varying roughness are used to address a temperature nonuniformity that is only present at the center or edge of the substrate.

Each of the individual regions 251-253, 261-263 can cover a nontrivial portion of the first portion 2411 of the outer surface 241 of the coating 240. For example, in some embodiments, each individual region 251-253 can cover at least 2.5%, at least 5%, at least 10%, at least 15%, or at least 25% of an area enclosed by the outer rim 210 and corresponding to the front side 208 of the inner dish 202.

In some embodiments, the first set of regions 250 can have an average level of roughness that is at least 50% greater, at least two times greater, at least five times greater, or at least ten times greater than the average level of roughness of the second set of regions 260. Conversely, in other embodiments, the second set of regions 260 can have an average level of roughness that is at least 50% greater, at least two times greater, at least five times greater, or at least ten times greater than the average level of roughness of the first set of regions 250.

Determining whether to form the first set of regions 250 to have a rougher surface than the second set of regions 260 can be based on (1) where the temperature nonuniformities on the substrate 50 are located during processing performed on an otherwise similar susceptor without any roughness modifications and (2) the temperature difference between the susceptor 200 and the substrate 50 during the process being performed. A surface with a higher level of roughness can have more surface area per unit of area across a two-dimensional plane (e.g., the XY plane in FIG. 2C) than an otherwise similar surface having a lower level lower of roughness. Thus, the regions of the outer surface 241 of the susceptor 200 with the higher average level of roughness and greater surface area can have a higher view factor and radiate more heat to the substrate 50 or absorb more heat from the substrate 50 depending on the temperature difference between the susceptor 200 and the substrate 50 during the given process when compared to similarly sized regions of the outer surface 241 having lower average levels of roughness. Thus, it follows that the average level of roughness of the outer surface 241 of the coating 240 of the susceptor 200 can be adjusted across the different regions of the outer surface 241 (e.g., regions 250, 260) to counteract the temperature nonuniformities across substrate that exist when the substrate is processed on an otherwise similar susceptor having an outer surface with an unmodified level of roughness (e.g., relatively constant level).

Because susceptors (e.g., susceptor 200) are often rotated during processing, the temperature nonuniformities of the substrate during processing as well as the nonuniformities of the process results (e.g., thickness deposition nonuniformities) often present in ring-like patterns across the surface of the substrate 50. Thus, using the susceptor 200 having the coating 240 with the outer surface 241 that includes the regions 250, 260 with substantially different average levels of roughness and that all have a ringed shape except the central region 251 is one example of a solution to address temperature nonuniformities on a substrate that present in a ring-like pattern. For processes in which the susceptor is not rotated, a pattern for varying the roughness across the susceptor other than a ring-shaped pattern (see e.g., FIG. 6)

may be more useful for addressing nonuniformities across the substrate, such as temperature non-uniformities.

In some embodiments, the difference in the average levels of roughness between the regions 250, 260 can be obtained by (1) roughening one set of the regions 250, 260 without modifying the other, (2) smoothing one set of the regions 250, 260 without modifying the other, or (3) modifying each of the regions 250, 260 with roughening or smoothing. In some embodiments, smoothing can be done by polishing. Polishing a region of a surface reduces the roughness of that region relative to unpolished regions. Roughening a region increases the roughness of that region relative to unroughened regions. Roughening can be done creating by grooves, scratches, divot-like patterns, or other surface features using machining, blasting, milling, and other techniques. In some embodiments, laser energy can also be used to modify the roughness of a surface.

Although the susceptor 200 is described as having a first set of regions 250 with a first average level of roughness and second set of regions 260 with a second average level of roughness, there is no requirement to have only two levels of roughness. For example, some embodiments of susceptors can include three or more regions of a given surface that each have a different average level of roughness. In one embodiment of the susceptor 200, each of the six different regions 251-253, 261-263 individually has an average level of roughness that is substantially different from each of the other five regions. Each susceptor (see e.g., FIGS. 2A-6) described in this disclosure can have a surface (e.g., a surface of the coating 240 or the base 201) that can include three or more regions that each have an average level of roughness that is substantially different from the average level of roughness of the other two or more regions on that surface. Furthermore, although the susceptors disclosed herein are only described as having a base and a single coating, other susceptors can include three or more components (e.g., layers) each having surfaces for which the roughness can be modified to improve the temperature uniformity of a process to be performed on the susceptor.

Figure 3:
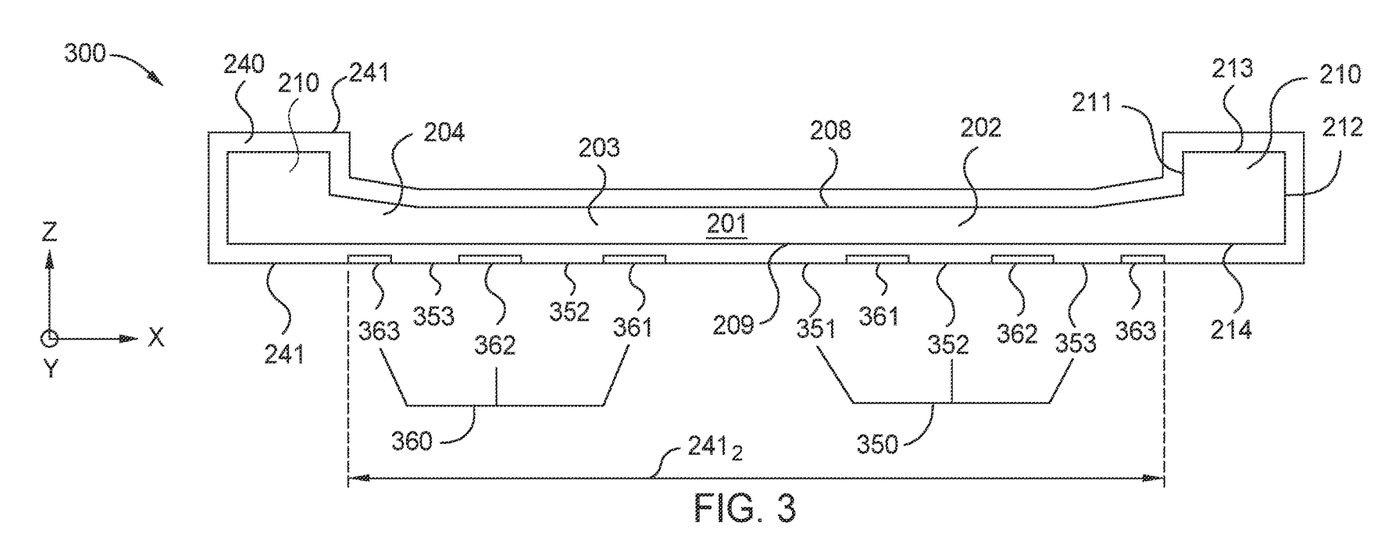
FIG. 3 is a side cross-sectional view of a susceptor, according to another embodiment.

FIG. 3 is a side cross-sectional view of a susceptor 300, according to another embodiment. The susceptor 300 is the same as the susceptor 200 described above except that a different portion of the outer surface 241 of the coating 240 includes regions with different average levels of roughness. On the susceptor 300, a lower portion 2412 of the outer surface 241 of the coating 240 underlying the inner dish 202 includes regions with different average levels of roughness instead of the first portion 2411 of the outer surface 241 that overlies the inner dish 202 on the susceptor 200.

The lower portion 2412 (first portion) of the outer surface 241 includes a first set of regions 350 and a second set of regions 360. The first set of regions 350 includes a first region 351, a second region 352, and a third region 353. The second set of regions 360 includes a first region 361, a second region 362, and a third region 363. The level of roughness of the first set of regions 350 is substantially different than the level of roughness of the second set of regions 360. For example, the average level of roughness Ra of the first set of regions 350 can be at least 50% greater than the average level of roughness Ra of the second set of regions 360.

Although not shown, a bottom view of the lower portion 2412 of the susceptor 300 can look the same as the top view of the first portion 2411 of the susceptor 200 shown in FIG. 2C. For example, the first region 351 can have a circular shape in the XY plane. The second region 352 and the third region 353 can have a shape of a ring in the XY plane.

Similarly, the first region 361, the second region 362, and the third region 363 can each have a shape of a ring in the XY plane. The first region 361 is located between the first region 351 and the second region 352. The second region 352 is located between the first region 361 and the second region 362. The second region 362 is located between the second region 352 and the third region 353. The third region 353 is located between the second region 362 and the third region 363. The third region 363 is located between the third region 353 and the bottom 214 of the outer rim 210.

The roughness of the regions 350, 360 can be modified for the same reasons as described above for the regions 250, 260 on the susceptor 200. For example, roughening a region can increase a surface area of that region across a two-dimensional area of that region (e.g., across an area in the XY plane of FIG. 3). The increased surface area increases the radiative heat transfer for that region relative to the unroughened regions of the same size. On the other hand, smoothing (e.g., polishing) a region can reduce the surface area of that region across a two-dimensional area of that region (e.g., across an area in the XY plane of FIG. 3), which can decrease the radiative heat transfer and effective emissivity for that region relative to the unsmoothed regions of the same size.

In some embodiments, modifying the roughness of a bottom surface of the susceptor 300 as shown in FIG. 3 can be easier than modifying the roughness of a top surface of the susceptor 200 as shown in FIG. 2A because the bottom of a susceptor is often a flat surface while the top surface of the susceptor that underlies the substrate during processing often has some slope or a curve which can make certain roughening or polishing techniques more challenging. Furthermore, the inner dish 202 being recessed inside the outer rim 210 can also make modifying the roughness of the top surface of the susceptor more challenging than modifying the roughness of the bottom surface of the susceptor.

Figure 4:
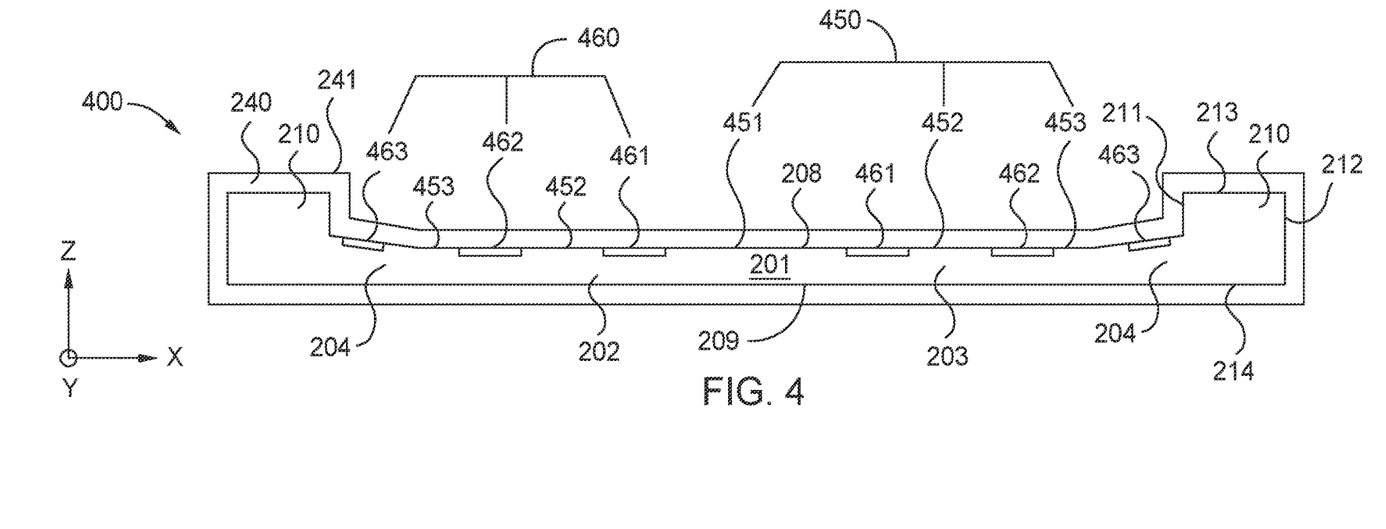
FIG. 4 is a side cross-sectional view of a susceptor, according to another embodiment.

FIG. 4 is a side cross-sectional view of a susceptor 400, according to another embodiment. The susceptor 400 is the same as the susceptor 200 (see FIGS. 2A-2C) described above except that the front side 208 of the inner dish 202 of the base 201 includes regions with different levels of roughness instead of the outer surface 241 of the coating 240 including different level of roughness. The front side 208 of the inner dish 202 is the surface of the base 201 that faces the substrate during processing. The roughness of the front side 208 of the inner dish 202 can be modified (e.g., roughened or smoothed) before the coating 240 is formed over the base 201.

The front side 208 of the inner dish 202 includes a first set of regions 450 and a second set of regions 460. The first set of regions 450 includes a first region 451, a second region 452, and a third region 453. The second set of regions 460 includes a first region 461, a second region 462, and a third region 463. The average level of roughness of the first set of regions 450 is substantially different than the average level of roughness of the second set of regions 460, such as the average level of roughness Ra of the first set of regions 450 being at least 50% greater than the average level of roughness Ra of the second set of regions 460.

The front side 208 of the inner dish 202 has the same size in the XY plane as the first portion 2411 of the outer surface 241 of the coating 240 shown in the XY plane of FIG. 2C. Although not shown, a top view of the front side 208 of the inner dish 202 of the susceptor 400 can look the same as the top view of the first portion 2411 of the susceptor 200 shown in FIG. 2C. For example, the first region 451 can have a circular shape in the XY plane. The second region 452 and the third region 453 can have a shape of a ring in the XY plane. Similarly, the first region 461, the second region 462, and the third region 463 can each have a shape of a ring in the XY plane. The first region 461 is located between the first region 451 and the second region 452. The second region 452 is located between the first region 461 and the second region 462. The second region 462 is located between the second region 452 and the third region 453. The third region 453 is located between the second region 462 and the third region 463. The third region 463 is located between the third region 453 and the inner edge 211 of the outer rim 210.

The roughness of one or more of the regions 450, 460 can be modified (e.g., smoothed or roughened) for the same reasons as described above for modifying the roughness of one or more of the regions 250, 260 on the susceptor 200. For example, roughening a region can increase a surface area of that region across a two-dimensional area of that region (e.g., across an area in the XY plane of FIG. 4). The increased surface area increases the heat transfer for that region relative to the unroughened regions of the same size. Similarly, smoothing a region can reduce the surface area and heat transfer for a region as described above.

Figure 5:
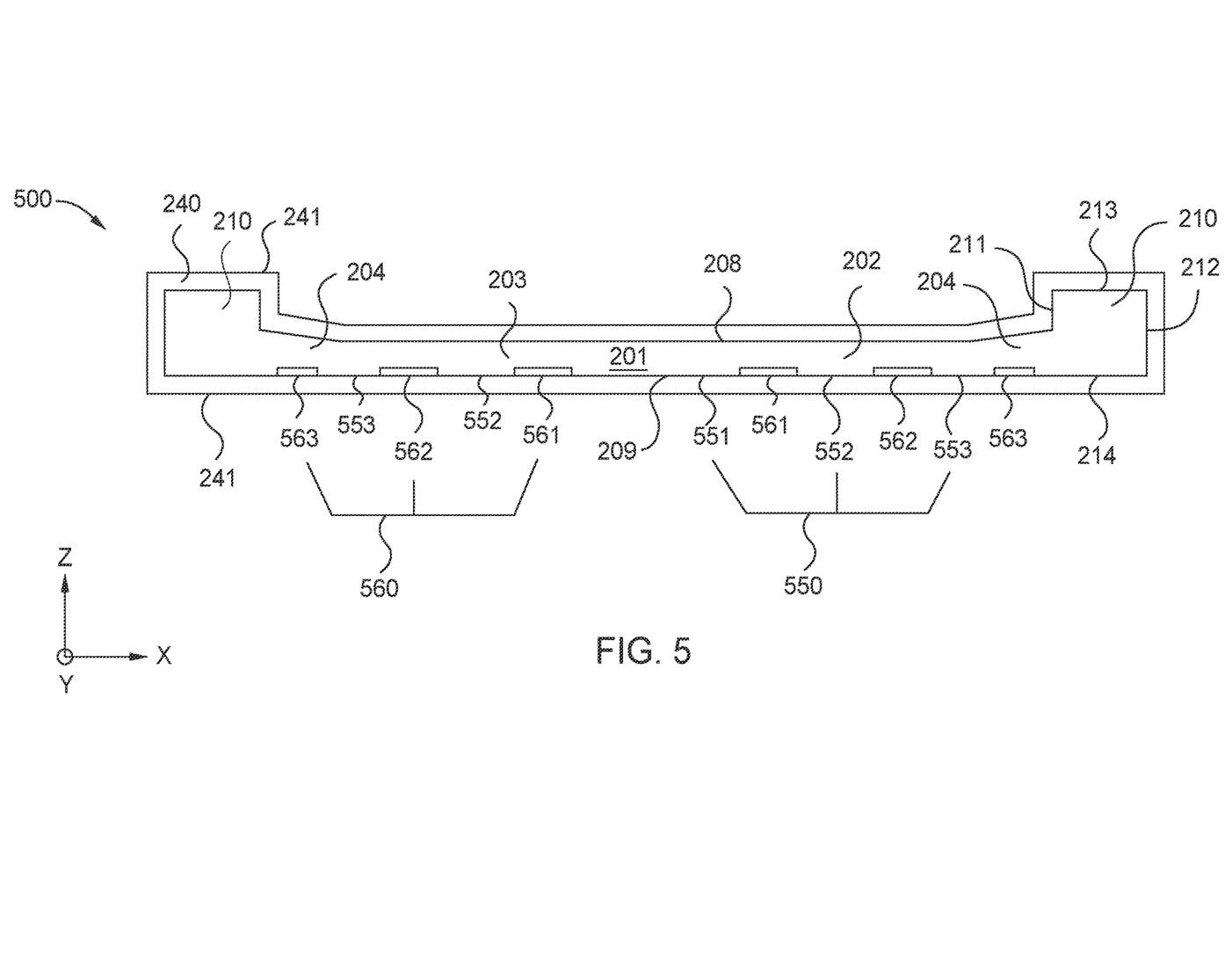
FIG. 5 is a side cross-sectional view of a susceptor, according to another embodiment.

FIG. 5 is a side cross-sectional view of a susceptor 500, according to another embodiment. The susceptor 500 is the same as the susceptor 200 (see FIGS. 2A-2C) described above except that the back side 209 of the inner dish 202 includes regions with different levels of roughness instead of the first portion 2411 of the outer surface 241 of the coating 240 including different level of roughness. The roughness of the back side 209 of the inner dish 202 can be modified (e.g., roughened or smoothed) before the coating 240 is formed over the base 201.

The back side 209 of the inner dish 202 includes a first set of regions 550 and a second set of regions 560. The first set of regions 550 includes a first region 551, a second region 552, and a third region 553. The second set of regions 560 includes a first region 561, a second region 562, and a third region 563. The level of roughness of the first set of regions 550 is substantially different than the level of roughness of the second set of regions 560, such as the average level of roughness Ra of the first set of regions 550 being at least 50% greater than the average level of roughness Ra of the second set of regions 560.

The back side 209 of the inner dish 202 has the same size in the XY plane as the first portion 2411 of the outer surface 241 of the coating 240 shown in the XY plane of FIG. 2C. Although not shown, a bottom view of the back side 209 of the inner dish 202 of the susceptor 500 can look the same as the top view of the first portion 2411 of the susceptor 200 shown in FIG. 2C. For example, the first region 551 can have a circular shape in the XY plane. The second region 552 and the third region 553 can have a shape of a ring in the XY plane. Similarly, the first region 561, the second region 562, and the third region 563 can each have a shape of a ring in the XY plane. The first region 561 is located between the first region 551 and the second region 552. The second region 552 is located between the first region 561 and the second region 562. The second region 562 is located between the second region 552 and the third region 553. The third region 553 is located between the second region 562 and the third region 563. The third region 563 is located between the third region 553 and the bottom 214 of the outer rim 210.

The roughness of the regions 550, 560 can be modified for the same reasons as described above for the regions 250, 260 on the susceptor 200. For example, roughening a region can increase a surface area of that region across a two-dimensional area of that region (e.g., across an area in the XY plane of FIG. 5). The increased surface area increases the heat transfer for that region relative to the unroughened regions of the same size. Similarly, smoothing (e.g., polishing) a region can reduce the surface area and heat transfer for a region as described above.

For the susceptors 400, 500 (see FIGS. 4 and 5), a roughness of a surface of the base 201 is modified instead of a roughness of a surface of the coating as described above for the susceptors 200 and 300 (see FIGS. 2A-2C and 3). In some embodiments, modifying the roughness of the surface of base 201 as opposed to a surface of the coating can be preferred, for example when modifying the roughness of the surface of the base is easier (e.g., easier to machine) or can be done with more precision than modifying the roughness of a surface of a coating formed over the base. Modifying the roughness of the base can also be used when the susceptor is formed of a single material (e.g., a susceptor monolithically formed of silicon carbide).

Figure 6:
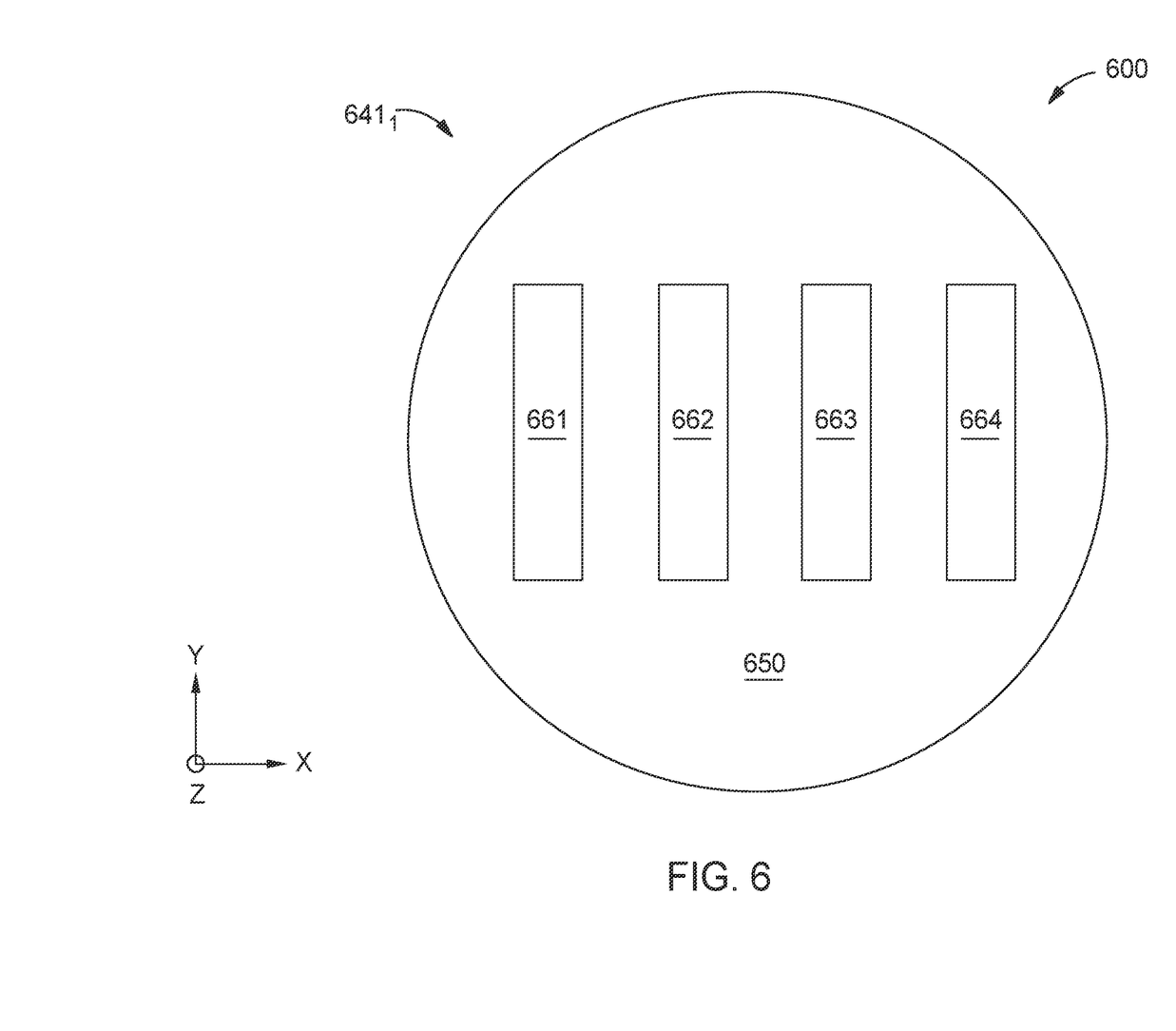
FIG. 6 is a top view of a first portion of a susceptor, according to another embodiment.

FIG. 6 is a top view of a first portion 6411 of a susceptor 600, according to another embodiment. The susceptor 600 is the same as the susceptor 200 (see FIGS. 2A-2C) described above except that the susceptor 600 includes the first portion 6411 of the outer surface 241 of the coating 240 that has a different pattern of regions with different average levels of roughness when compared to the first portion 2411 of the susceptor 200 shown in FIG. 2C. The first portion 6411 of the susceptor 600 is the same size and is in the same location over the base 201 as the first portion 2411 of the susceptor 200. With reference to FIG. 2A and Figures, the first portion 6411 of the outer surface 241 of the susceptor 600 overlies the central portion 203 and the outer portion 204 of the inner dish 202.

The first portion 6411 includes a first region 650. The first portion 6411 includes a set of regions 661-664. The set of regions 661-664 are spaced apart from each other by the first region 650. The first region 650 can surround each of the regions 661-664. Each of the individual regions 650 and 661-664 can cover a nontrivial portion of the first portion 6411 of the outer surface 241 of the coating 240. For example, in some embodiments, each individual region 650 and 661-664 can cover at least 5%, at least 10%, at least 15%, or at least 25% of an area corresponding to the front side 208 of the inner dish 202.

Susceptors, such as the susceptor 600 that include a coating with a plurality of non-ring-shaped regions that have at least two more substantially different average levels of roughness can be useful for processes in which the susceptor does not rotate during the process. Although the regions 661-664 are shown as rectangles, the regions 661-664 can have any shape including irregular shapes.

The shapes and locations of the regions having the different average levels of roughness for each of the susceptors 200-600 described above can be based on: (1) the components in the process chamber in which the susceptor is used; (2) each different configuration for a given process chamber (e.g., different susceptor locations); and (3) each different process performed in a given process chamber. Some examples of components of given process chamber that can cause temperature non-uniformities that the susceptors described herein can be used to address include (1) the lamp layout in the process chamber, (2) the relative uniformity of radiation reflected by the reflector of the process chamber, and (3) gas flows in the process chamber including gas flows of precursor gases and cooling gases.

In some embodiments, a susceptor can include non-ring shaped regions (e.g., regions 661-664) and one or more ring-shaped regions (e.g., third region 263 from FIG. 2C). This can be useful, for example, when a susceptor is not rotated, but still has a nonuniformity near the edge of the substrate during processing.

Although each susceptor disclosed in FIGS. 2A-6 provides an example of a susceptor having one surface that is modified to have different average levels of roughness, the benefits of this disclosure can be used to modify two or more surfaces of a given susceptor to improve the uniformity of a process being on the susceptor. For example, in one embodiment the outer surface 241 of the coating 240 is modified to have regions with different average levels of roughness on the front side 208 of the inner dish 202 (see e.g., FIG. 2A) and regions with different average levels of roughness on the back side 209 of the inner dish 202 (see e.g., FIG. 3). In another embodiment, the outer surface of the front side 208 (see e.g., FIG. 4) and the back side 209 (see e.g., FIG. 5) of the base 201 are each modified to have regions with different average levels of roughness. In yet another embodiment, each of the front side and back side of the coating 240 and the base 201 are modified to have regions with different average levels of roughness, so that there are four different surfaces on the susceptor having regions with different average levels of roughness.

In another embodiment, one or more regions have an average level of roughness that changes gradually through the region. For example, in one embodiment, a middle region (e.g., first region 261 in FIG. 2C) is located between a first region (e.g., first region 251) and a second region (e.g., second region 252), and the average level of roughness in the middle region can taper from a first average level of roughness (e.g., 40 μm) at the border between the middle region and the first region to a second average level of roughness (e.g., 80 μm) at the border between the middle region and the second region. In another embodiment, the average level of roughness in a region can increase from the borders of the region to a maximum at an intermediate location (e.g., a center) of the region between the borders. In another embodiment, the average level of roughness in a region can decrease from the borders of the region to a minimum at an intermediate location (e.g., a center) of the region between the borders. Other profiles of varying the roughness within a region can also be provided without departing from the scope of this disclosure.

Although much of this disclosure describes susceptors including a base and a coating, the benefits described above can also be applied to susceptors formed of a single material (e.g., a monolithically formed silicon carbide susceptor). For susceptors formed of a single material, the roughness of the outer surface can be modified in a similar manner as described for the susceptors disclosed above. Furthermore, although the benefits of this disclosure relating to the roughness modifications are described as applying to susceptors used for depositions that include an outer rim and a recessed inner dish, the benefits of these roughness modifications can apply to any component used to support a substrate during a process including (1) susceptors having different shapes (e.g., a substantially flat disc-shaped susceptor), (2) susceptors used for different processes (e.g., a susceptor used for a preclean process), (3) devices that can support more than one substrate (e.g., a wafer boat), or (4) any other substrate support including substrate supports that are permanently fixed in a corresponding process chamber.

While the foregoing is directed to embodiments of the present disclosure, other and further embodiments of the disclosure may be devised without departing from the basic scope thereof.

What is claimed is:

1. A susceptor for processing a substrate, comprising:
    a base comprising:
        an outer rim having an inner edge, an outer edge, and a top connecting the inner edge to the outer edge; and
        an inner dish disposed inside the outer rim and coupled to the outer rim, the inner dish recessed from the top of the outer rim, the inner dish having a front side and an opposing back side; and
    a coating formed over the base, the coating having an outer surface that includes a first portion formed over the front side of the inner dish, wherein
        the first portion of the outer surface of the coating includes a first region and a second region,
        the first region has a first average level of roughness,
        the second region has a second average level of roughness,
        the first average level of roughness is at least 50% greater than or 33% less than the second average level of roughness; and
        a level of roughness in the first region gradually changes from a first level at a first border of the first region to a second level at a second border of the first region.

2. The susceptor of claim 1, wherein the first region and the second region are each a ring-shaped region.

3. The susceptor of claim 1, wherein the first portion of the outer surface further includes a third region that is spaced apart from the first region by the second region.

4. The susceptor of claim 3, wherein the first region, the second region, and the third region are each a ring-shaped region.

5. The susceptor of claim 3, wherein the third region surrounds the first region and the second region.

6. The susceptor of claim 3, wherein the third region has a third average level of roughness that is substantially different from the first average level of roughness and the second average level of roughness.

7. The susceptor of claim 3, wherein the third region has an average level of roughness that is substantially the same as the first average level of roughness.

8. The susceptor of claim 1, wherein the first average level of roughness is at least ten times greater than or ten times less than the second average level of roughness.

9. A susceptor for processing a substrate, comprising:
    a base comprising:
        an outer rim having an inner edge, an outer edge, and a top connecting the inner edge to the outer edge; and
        an inner dish disposed inside the outer rim and coupled to the outer rim, the inner dish recessed from the top of the outer rim, the inner dish having a front side and an opposing back side, wherein:
            an outer surface of the base includes a portion on the front side of the inner dish or the back side of the inner dish,
            the portion includes a primary region and a secondary region,
            an average level of roughness of the primary region is at least 50% greater than or 33% less than an average level of roughness of the secondary region; and a coating formed over the base, the coating having an outer surface that includes a first portion formed over the back side of the inner dish, wherein:
the first portion of the outer surface of the coating includes a first region and a second region,
the first region has a first average level of roughness,
the second region has a second average level of roughness, and
the first average level of roughness is at least 50% greater than or 33% less than the second average level of roughness.

10. The susceptor of claim 9, wherein the first region and the second region are each a ring-shaped region.

11. The susceptor of claim 9, wherein the first portion of the outer surface further includes a third region that is spaced apart from the first region by the second region.

12. The susceptor of claim 11, wherein the first region, the second region, and the third region are each a ring-shaped region.

13. The susceptor of claim 11, wherein the third region surrounds the first region and the second region.

14. The susceptor of claim 11, wherein the third region has a third average level of roughness that is substantially different from the first average level of roughness and the second average level of roughness.

15. The susceptor of claim 11, wherein the third region has an average level of roughness that is substantially the same as the first average level of roughness.

16. The susceptor of claim 9, wherein the first average level of roughness is at least ten times greater than or ten times less than the second average level of roughness.

17. A susceptor for processing a substrate, comprising:
a base comprising:
an outer rim having an inner edge, an outer edge, and a top connecting the inner edge to the outer edge; and
an inner dish disposed inside the outer rim and coupled to the outer rim, the inner dish recessed from the top of the outer rim, the inner dish having a front side and an opposing back side, wherein
an outer surface of the base includes a first portion on the front side of the base or the back side of the base,
the first portion includes a first region and a second region,
the first region has a first average level of roughness,
the second region has a second average level of roughness, and
the first average level of roughness is at least 50% greater than or 33% less than the second average level of roughness; and
a coating formed over the first region and the second region of the first portion of the base.

18. The susceptor of claim 17, the first portion of the outer surface of the base is on the front side of the base.

19. The susceptor of claim 17, the first portion of the outer surface of the base is on the back side of the base.

20. The susceptor of claim 17, wherein
the first portion of the outer surface further includes a third region that is spaced apart from the first region by the second region, and
the third region has a third average level of roughness that is substantially different from the second average level of roughness.

* * * * *